United States Patent
Su

(10) Patent No.: US 6,628,071 B1
(45) Date of Patent: Sep. 30, 2003

(54) PACKAGE FOR ORGANIC ELECTROLUMINESCENT DEVICE

(75) Inventor: Chih-Hung Su, Kaohsung (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 10/065,344

(22) Filed: Oct. 7, 2002

(30) Foreign Application Priority Data

Sep. 3, 2002 (TW) ........................................ 91120043 A

(51) Int. Cl.$^7$ ................................................ H05B 33/00
(52) U.S. Cl. ........................ 313/512; 313/504; 313/506; 313/509; 428/917
(58) Field of Search ................................. 313/512, 506, 313/509, 504; 315/169.3; 428/690, 917

(56) References Cited

U.S. PATENT DOCUMENTS

| | | | |
|---|---|---|---|
| 5,811,177 A | * | 9/1998 | Shi et al. .................... 313/500 |
| 5,895,228 A | * | 4/1999 | Bibuyck et al. ............... 438/99 |
| 5,952,778 A | * | 9/1999 | Haskal et al. ................ 313/504 |
| 6,150,187 A | * | 11/2000 | Zyung et al. .................. 438/26 |
| 6,198,217 B1 | * | 3/2001 | Suzuki et al. ................ 313/504 |

\* cited by examiner

*Primary Examiner*—Ashok Patel
(74) *Attorney, Agent, or Firm*—Jiang Chyun IP Office

(57) ABSTRACT

A package for an organic electroluminescent device, having a substrate, an organic electroluminescent device, a sealant, and a cover plate. The organic electroluminescent device and the sealant are disposed on the substrate. The sealant is a frame-like resin surrounding the electroluminescent device. The sealant is basically made of an ultra-violet curing resin and a thermal curing resin. The cover plate is disposed over the substrate and is connected thereto via the sealant, such that the organic electroluminescent device can be covered thereby.

8 Claims, 5 Drawing Sheets

PACKAGE FOR ORGANIC ELECTROLUMINESCENT DEVICE

CROSS REFERENCE TO RELATED APPLICATIONS

This application claims the priority benefit of Taiwan application serial no. 91120043, filed Sep. 3, 2002.

BACKGROUND OF THE INVENTION

1. Field of the Invention

The invention relates in general to a package for an organic electroluminescent (EL) device, and more particularly, to a package for an organic electroluminescent device using an ultra-violet (UV) curing resin and a thermal curing resin as a sealant.

2. Related Art of the Invention

The basic structure of an organic electroluminescent device includes an anode, a cathode, and an organic thin film with luminescent property sandwiched in between. By applying an appropriate bias, the holes are injected from the anode, and the electrons are injected from the cathode. The application of the external bias generates an external potential to provide mobility of the carriers, that is, the holes and electrons in the thin film. As a result, the carriers recombine and generate energy. A part of the energy released by the recombination of electron and hole stimulates the luminescent molecules to a single excited state. When the excited luminescent molecules release energy and return to the ground state, a certain proportion of the energy is released to generate photons which produce illumination. This is the mechanism for electroluminescence. Having the properties of self-luminescence, wide viewing angle, high response speed, low driving voltage and full color, the organic electroluminescent devices have become the leading technology of flat panel displays for the next generation.

As the operation stability and endurance of the electroluminescent device is directly affected by the package thereof, the package is expected to have promising permeability and adhesion. The metal thin film (electrode) is easily deteriorated by moisture and oxygen, and the organic electroluminescent is easily photodegraded. Further, oxygen provides the path for forming radicals in the luminescent layer. The radicals include carbonyl that reduces the luminescent efficiency of the luminescence layer and breaks the molecular bonds to shorten the device lifetime. Therefore, absorbent is incorporated in the device, or one or multiple layers of protection are coated on the device to absorb or to prevent moisture and oxygen from permeating the package.

FIG. 1 shows a conventional package for an organic electroluminescent device. Referring to FIG. 1, the conventional package for the organic electroluminescent device includes a substrate 100, an organic electroluminescent device 102, a cover plate 104, and a sealant 108. The organic electroluminescent device is mounted on the substrate 100. The cover plate 104 is connected to the substrate 100 via the sealant 108 to enclose the organic electroluminescent device 102. The sealant 108 includes a frame-like resin surrounding the organic electroluminescent device 102. The cover plate 104 has a recess 104a to accommodate an absorbent 106 therein. The absorbent 106 prevents moisture and oxygen from permeating into the package of the organic electroluminescent device.

In the conventional package of the organic electroluminescent device, the sealant 108 is typically a UV curing resin or a thermal curing resin. When the UV curing resin is used for the sealant 108, the package has very good permeability. However, the adhesion between the substrate 100 and the cover plate 104 is not ideal. When the thermal curing resin is used for the sealant 108, proper adhesion is obtained; however, the permeability is poor. Therefore, neither the UV curing resin or the thermal curing resin can provide sufficient permeability and adhesion at the same time.

SUMMARY OF INVENTION

The present invention provides a package for an organic electroluminescent device with sufficient permeability and adhesion.

The package of the organic electroluminescent device provided by the present invention includes a substrate, an organic electroluminescent device, a sealant, and a cover plate. The organic electroluminescent device and the sealant are disposed on the substrate, while the sealant includes a frame-like resin surrounding the organic electroluminescent device. The sealant includes both a UV curing resin and a thermal curing resin. The cover plate is located over the substrate and connected thereto via the sealant, such that the organic electroluminescent device is enclosed thereby.

In one embodiment of the present invention, the disposition of the UV curing resin and the thermal curing resin of the sealant includes: (1) the UV curing resin is located at the side near the organic electroluminescent device, while the thermal curing resin is located at a distal side of the organic electroluminescent device; (2) the thermal curing resin is located at the side near the organic electroluminescent device, while the UV curing resin is located at a distal side of the organic electroluminescent device; (3) the thermal curing resin is covered by the UV curing resin; and (4) the UV curing resin is covered by the thermal curing resin.

In one embodiment of the present invention, an absorbent is further included in the cover plate. The absorbent is not in contact with the organic electroluminescent device. A recess can be made in the cover plate to accommodate the absorbent, such that the thickness of the whole package can be reduced.

BRIEF DESCRIPTION OF DRAWINGS

These, as well as other features of the present invention, will become more apparent upon reference to the drawings wherein.

DETAILED DESCRIPTION

Figure 1:
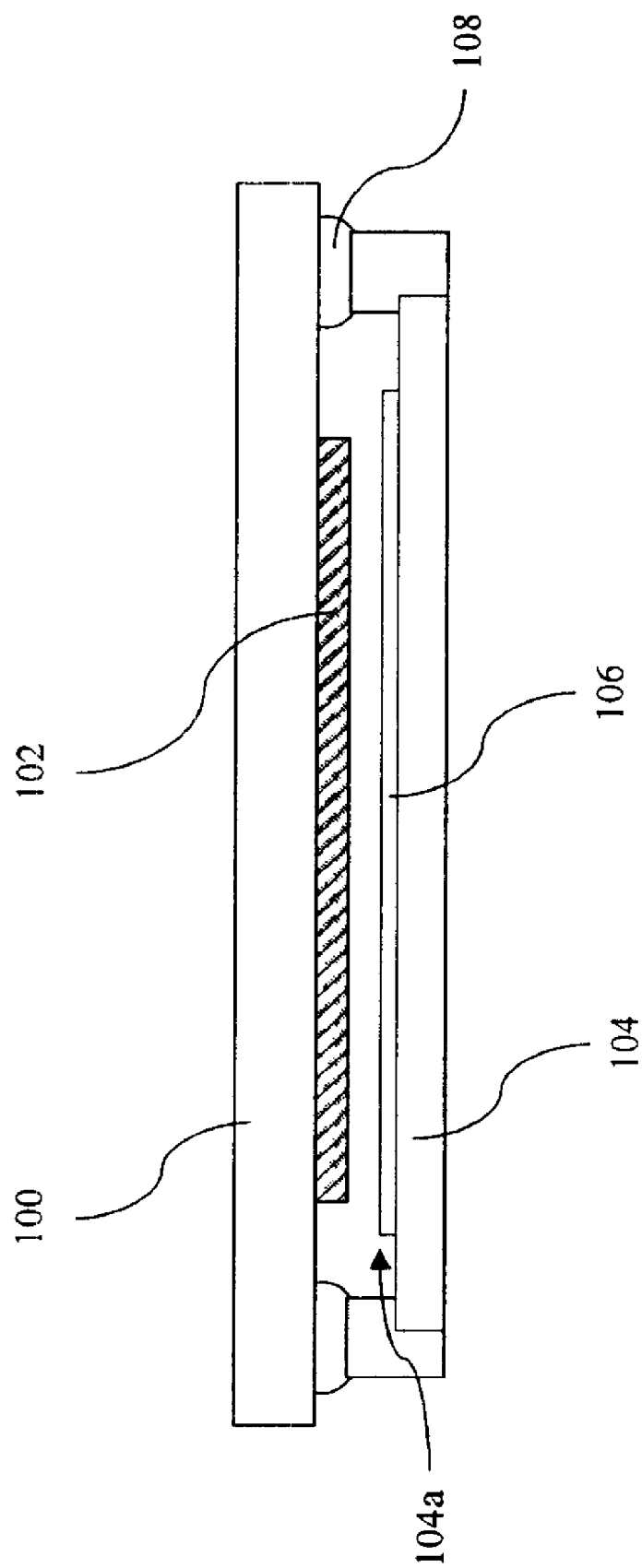
FIG. 1 shows a conventional package of an organic electroluminescent device.
Figure 2:
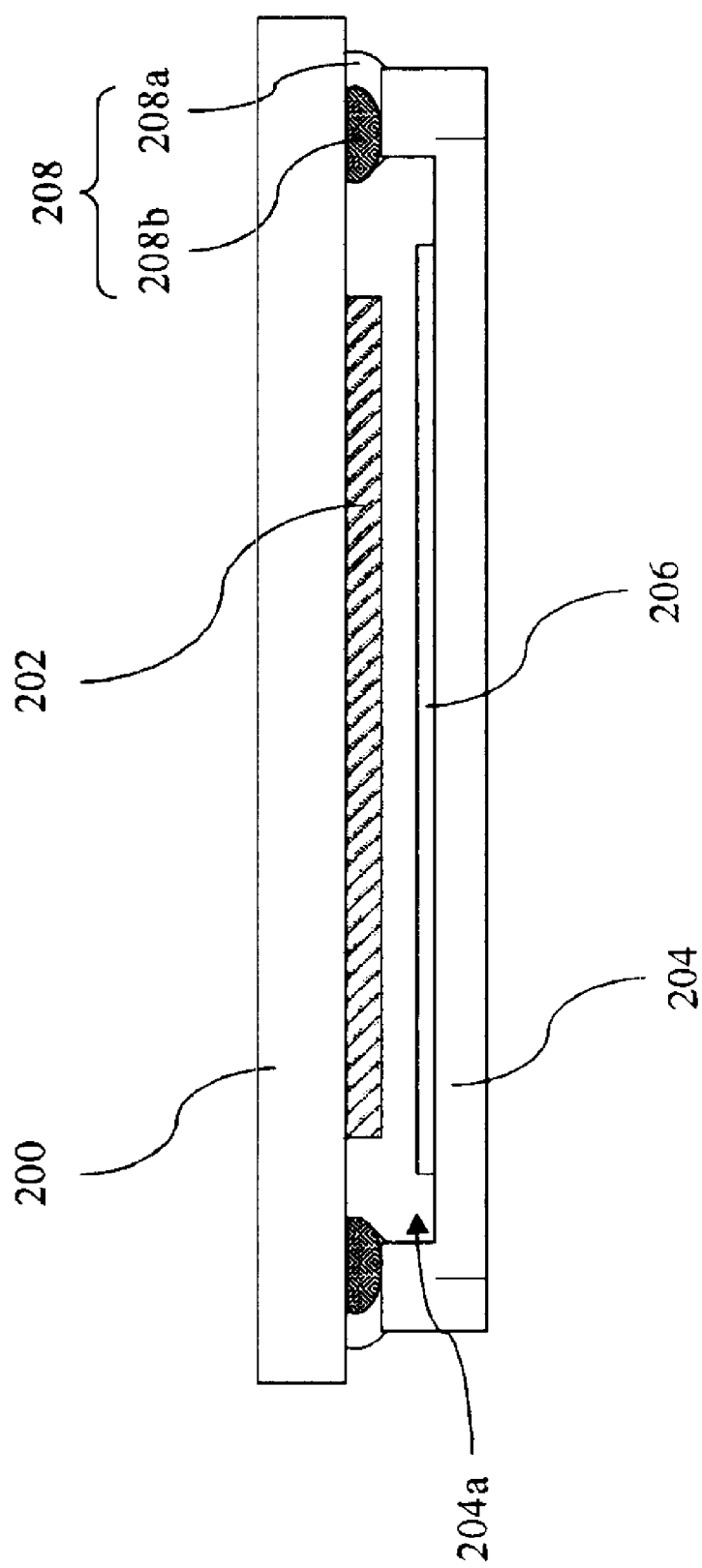
FIGS. 2 to 5 show the schematic drawing of a package of an organic electroluminescent device in one embodiment of the present invention.

FIGS. 2 to 5 show the schematic drawing of a package of an organic electroluminescent device in one embodiment of the present invention. Referring to FIG. 2, the package includes a substrate 200, an organic electroluminescent device 202, a cover plate 204, and a sealant 208. The organic electroluminescent device 202 is disposed on the substrate 200. The cover plate 204 is connected to the substrate 200 via the sealant 208 to enclose the organic electroluminescent device 202 therein. The sealant 208 disposed between the substrate 200 and the cover plate 204 includes a frame-like resin surrounding the organic electroluminescent device 202.

In FIG. 2, the cover plate 204 has a recess 204a therein to accommodate an absorbent 206 therein. The absorbent 206 is used to prevent the moisture or oxygen permeating into the package of the organic electroluminescent device. It is appreciated that the absorbent 206 and the recess 204a for accommodating the absorbent 206 are not absolutely necessary for the present invention.

To provide sufficient adhesion and permeability between the substrate 200 and the cover plate 204, the sealant 208 comprises both an UV curing resin 208a and a thermal curing resin 208b. In this embodiment, although the UV curing resin 208a does not provide ideal adhesion, the application of the thermal curing resin 208b compensates for the deficiency of the UV curing resin 208a. In other words, the sealant 208 integrates the advantages of the UV curing resin 208a and the thermal curing resin 208b allowing the package to have sufficient adhesion and permeability at the same time.

Figure 3:
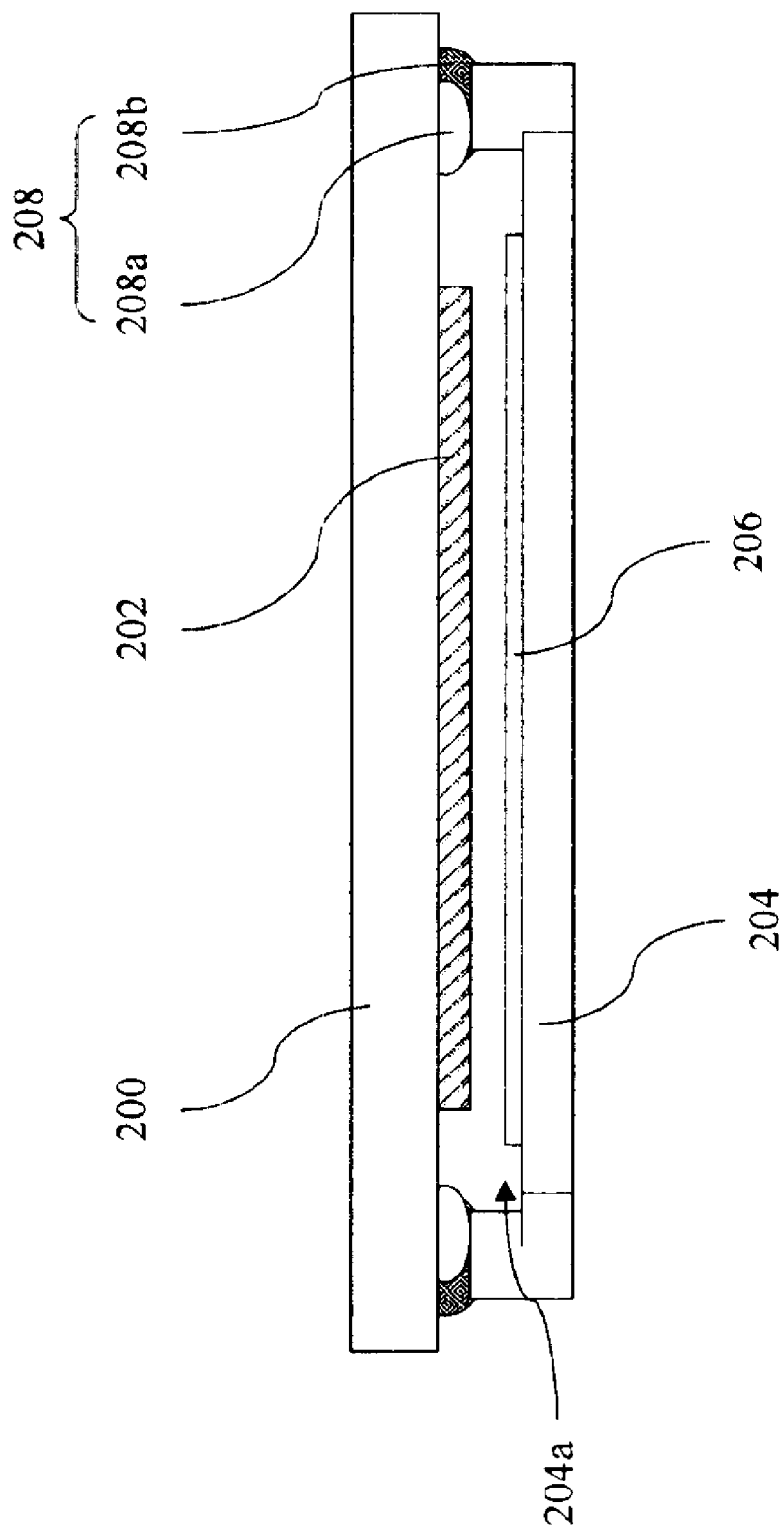
Figure 4:
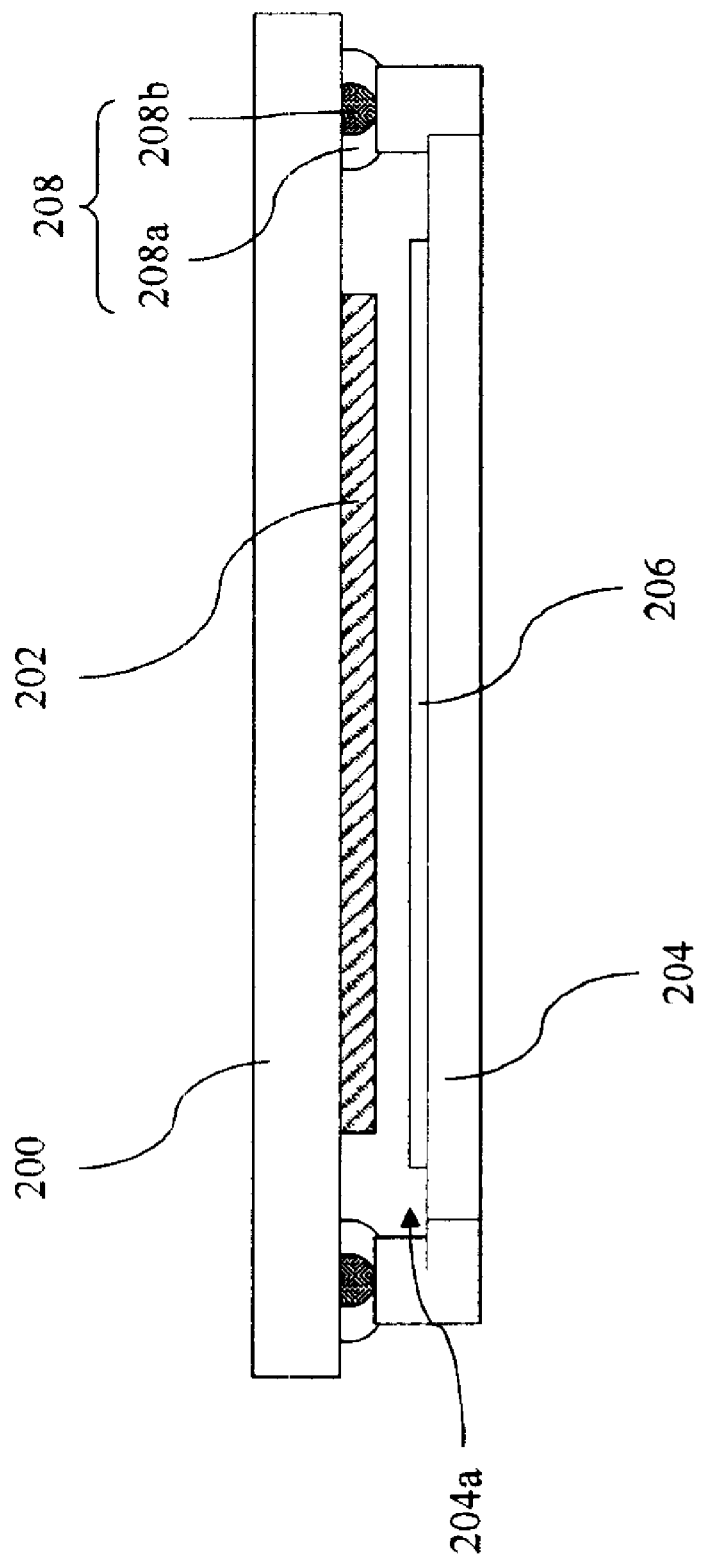
Figure 5:
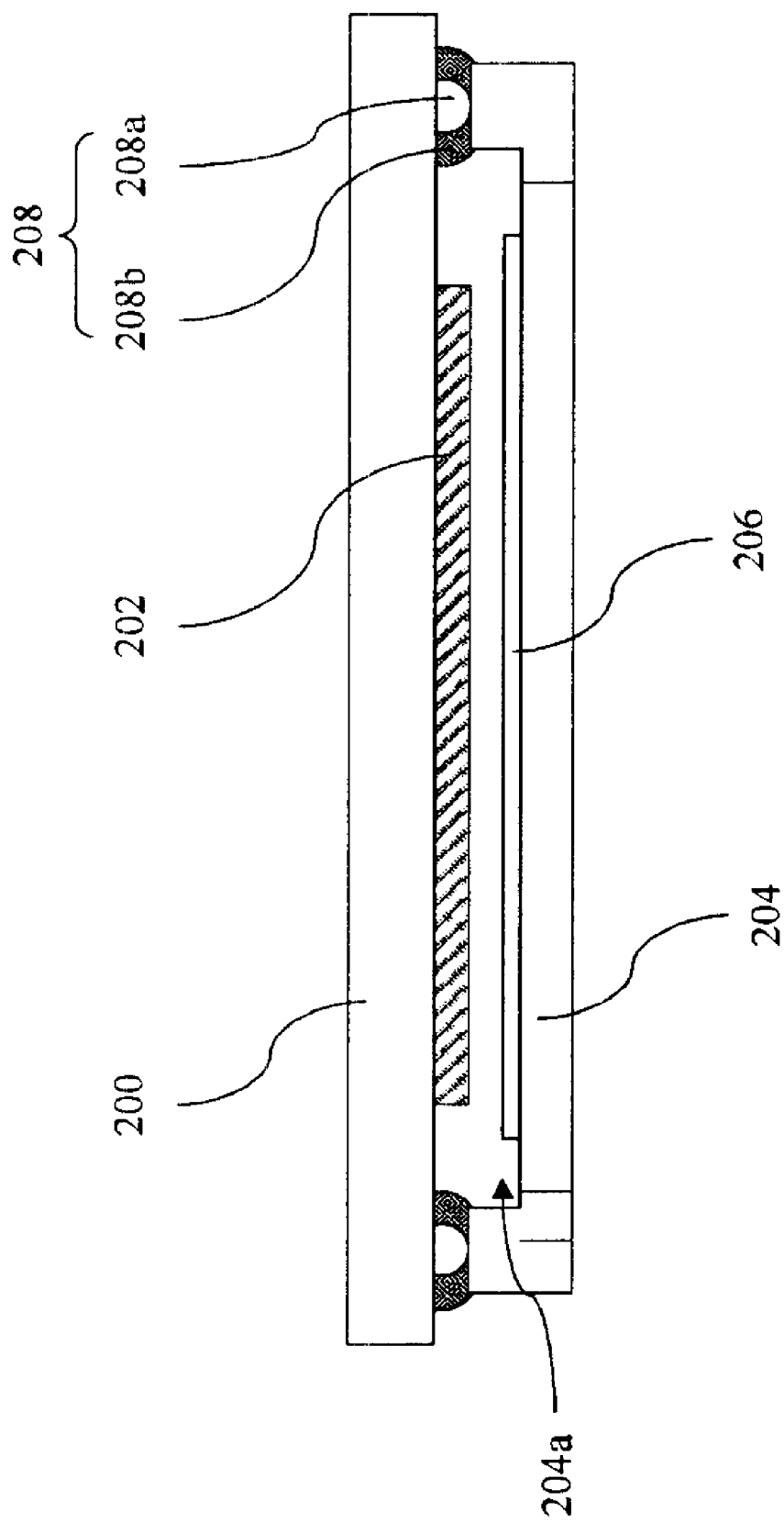

Referring to FIGS. 2 to 5, the disposition of the UV curing resin 208a and the thermal curing resin 208b of the sealant 208 is illustrated. In FIG. 2, the thermal curing resin 208b is located at a side near the organic electroluminescent device 202. That is, the thermal curing resin 208b is disposed as an inner periphery of the sealant 208, while the UV curing resin 208a is disposed as an outer periphery of the sealant 208. In FIG. 3, the UV curing resin 208a is disposed at the side near the organic electroluminescent device 202. In other words, the UV curing resin 208a is disposed as an inner periphery of the sealant 208, while the thermal curing resin 208b is disposed as an outer periphery of the sealant 208. In FIG. 4, the UV curing resin 208a encloses the thermal curing resin 208b therein. In FIG. 5, the thermal curing resin 208b encloses the UV curing resin 208a therein.

FIGS. 2 to 5 show the exemplary dispositions of the UV curing resin 208a and the thermal curing resin 208b. It is appreciated that other dispositions of the UV curing resin 208a and the thermal curing resin 208b can also be applied according to specific requirements without exceeding the scope of the present invention.

Accordingly, the package for an organic electroluminescent device provided by the present invention has at least the following advantages:

1. In the package of the organic electroluminescent device, the sealant includes both the UV curing resin and the thermal curing resin, such that both the adhesion and permeability can be obtained.

2. The UV curing resin and the thermal curing resin can be easily accessed, and the coating and curing process thereof is compatible with the current fabrication process.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A package for an organic electroluminescent device, comprising:

a substrate;

the organic electroluminescent device, disposed on the substrate;

a sealant, disposed on the substrate surrounding the organic electroluminescnet device, the sealant including an ultra-violet curing resin and a thermal curing resin; and a cover plate, disposed over the substrate and connected thereto via the sealant, such that the organic electroluminescent device is enclosed thereby.

2. The package according to claim 1, wherein the ultra-violet curing resin is located at a side near the organic electroluminescent device, and the thermal curing resin is located at a side distal to the organic electroluminescent device.

3. The package according to claim 1, wherein the thermal curing resin is located at a side near the organic electroluminescent device, and the ultra-violet curing resin is located at a side distal to the organic electroluminescent device.

4. The package according to claim 1, wherein the thermal curing resin encloses the ultra-violet resin therein.

5. The package according to claim 1, wherein the ultra-violet curing resin encloses the thermal curing resin therein.

6. The package according to claim 1, further comprising an absorbent located on the cover plate.

7. The package according to claim 1, wherein the cover plate further comprises a recess.

8. The package according to claim 7, further comprising an absorbent accommodated in the recess.

* * * * *